United States Patent
Shapiro et al.

(10) Patent No.: US 9,812,404 B2
(45) Date of Patent: Nov. 7, 2017

(54) ELECTRICAL CONNECTION AROUND A CRACKSTOP STRUCTURE

(71) Applicant: GLOBALFOUNDRIES INC., Grand Cayman (KY)

(72) Inventors: Michael J. Shapiro, Austin, TX (US); John A. Fitzsimmons, Poughkeepsie, NY (US); Natalia Borjemscaia, Wappingers Falls, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 14/984,547

(22) Filed: Dec. 30, 2015

(65) Prior Publication Data
US 2017/0194265 A1    Jul. 6, 2017

(51) Int. Cl.
*H01L 21/70* (2006.01)
*H01L 23/00* (2006.01)
*H01L 23/528* (2006.01)
*H01L 21/768* (2006.01)

(52) U.S. Cl.
CPC ...... *H01L 23/562* (2013.01); *H01L 21/76879* (2013.01); *H01L 21/76883* (2013.01); *H01L 21/76898* (2013.01); *H01L 23/528* (2013.01)

(58) Field of Classification Search
CPC ............... H01L 23/562; H01L 23/528; H01L 21/76879; H01L 21/76883; H01L 21/76889
USPC ........................................................ 257/508
See application file for complete search history.

(56) References Cited

U.S. PATENT DOCUMENTS

| | | |
|---|---|---|
| 5,851,903 A | 12/1998 | Stamper |
| 5,955,773 A | 9/1999 | Stamper |
| 6,104,079 A | 8/2000 | Stamper |
| 6,433,429 B1* | 8/2002 | Stamper ............ H01L 21/76843 257/654 |
| 6,815,813 B1 | 11/2004 | Dalton et al. |
| 7,307,346 B2 | 12/2007 | Kaltalioglu et al. |
| 7,589,419 B2 | 9/2009 | Oberle |
| 7,687,915 B2 | 3/2010 | Lee et al. |
| 8,188,574 B2 | 5/2012 | Angyal et al. |
| 2002/0024115 A1* | 2/2002 | Ibnabdeljalil ......... H01L 23/562 257/620 |
| 2005/0098893 A1* | 5/2005 | Tsutsue ................. H01L 23/564 257/758 |
| 2005/0280120 A1* | 12/2005 | Tomita .................. H01L 23/522 257/620 |
| 2008/0042292 A1* | 2/2008 | Adkisson .............. H01L 23/562 257/773 |

(Continued)

*Primary Examiner* — Trung Q Dang
(74) *Attorney, Agent, or Firm* — Michael LeStrange; Andrew M. Calderon; Roberts Mlotkowski Safran Cole & Calderon, P.C.

(57) ABSTRACT

The disclosure generally relates to semiconductor structures and, more particularly, to electrical connections used with crackstop structures and methods of manufacture. The structure includes: a conductive material; a dielectric material formed over the conductive material; a non-corrosive conductive material in at least one opening of the dielectric material and in direct contact with the conductive material; a crackstop structure formed over the dielectric material; and at least one of wiring layer in contact with the non-corrosive conductive material.

18 Claims, 4 Drawing Sheets

(56) References Cited

U.S. PATENT DOCUMENTS

| | | | |
|---|---|---|---|
| 2013/0187280 A1* | 7/2013 | Yuan | H01L 23/481 |
| | | | 257/773 |
| 2014/0021616 A1 | 1/2014 | Anzola et al. | |
| 2014/0091451 A1 | 4/2014 | Delpech et al. | |
| 2015/0093880 A1* | 4/2015 | Ji | H01L 21/02013 |
| | | | 438/459 |
| 2017/0025603 A1* | 1/2017 | Hara | H01L 43/12 |

* cited by examiner

ELECTRICAL CONNECTION AROUND A CRACKSTOP STRUCTURE

FIELD OF THE INVENTION

The present disclosure generally relates to semiconductor structures and, more particularly, to electrical connections used with crackstop structures and methods of manufacture.

BACKGROUND

In semiconductor fabrication, semiconductor chips are fabricated together on a single wafer. Fabrication of these chips generally involves forming several different structures on the wafer, including wiring layers, active devices and passive devices. These structures can be fabricated using conventional lithography, etching and deposition processes.

Scribe lines, also referred to as kerfs, are formed on the wafer during fabrication to separate the various chips. During the dicing stage, semiconductor chips are diced from each other by sawing the wafer along the scribe lines. It is during this dicing stage that issues can arise. Specifically, cracks can form in the wafer, which can then propagate throughout the chips. These cracks can cause defective chips. To prevent these cracks from propagating, crackstop structures are formed in dielectric material around the active area of each chip.

During the fabrication process, it is desirable to test the functionality of the ICs. However, testing during the fabrication process can be problematic. For example, electrically connecting from inside the crackstop structure to outside the crackstop structure may damage or even prevent the formation of a hermetic seal. Accordingly, functionality of the crackstop structure, itself, may be compromised.

SUMMARY

In an aspect of the disclosure, a structure includes: a conductive material; a dielectric material formed over the conductive material; a non-corrosive conductive material in at least one opening of the dielectric material and in direct contact with the conductive material; a crackstop structure formed over the dielectric material; and at least one of a wiring layer in contact with the non-corrosive conductive material.

In an aspect of the disclosure, a structure includes: a conductive material; a barrier layer over the conductive material; a non-corrosive conductive material in direct contact with the conductive material and within openings in the barrier layer; a crackstop structure formed in a dielectric material and separated from the conductive material by the barrier layer; and a plurality of wiring layers extending from and in direct electrical contact with the non-corrosive conductive and positioned on an inside and outside of the crackstop structure.

In an aspect of the disclosure, a method includes: forming a dielectric material over a conductive material; forming a non-corrosive conductive material in at least one opening of the dielectric material and in direct contact with the conductive material; forming a crackstop structure formed over the dielectric material; and forming at least one of a wiring layer in direct electrical contact with the non-corrosive conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to electrical connections used with crackstop structures and methods of manufacture. More specifically, the structures described herein provide an electrical connection from inside a crackstop structure to outside of the crackstop structure without losing a hermetic seal of the chip. In embodiments, the present disclosure accomplishes the advantages herein by introducing buried metal within the substrate (e.g., bulk silicon) to provide an electrical and hermetic pathway that relies on through silicon via (TSV) metal formation between the dielectric material of the wiring layers and an interconnect structure.

In embodiments, the structure includes an electrical connection from the inside to outside of the crackstop structure, which maintains crackstop structure functionality without requiring continuous, transverse wiring in the same plane as the crackstop structure. Further, in embodiments, the structure provides for a hermetic seal, while still providing the electrical connection from the inside to outside of the crackstop structure. Additionally, the structure uses a non-corrosive buried metal to make such connections. This buried metal is non-corrosive and will maintain the hermetic seal, by preventing corrosion from spreading to the underlying interconnect structure of the chip. Moreover, by implementing the buried metal, for example, the structure provides a conductive path for an electrical connection from the inside to outside of the crackstop structure, while still maintaining crackstop structure functionality and without requiring continuous, transverse wiring in the same plane as the crackstop structure.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
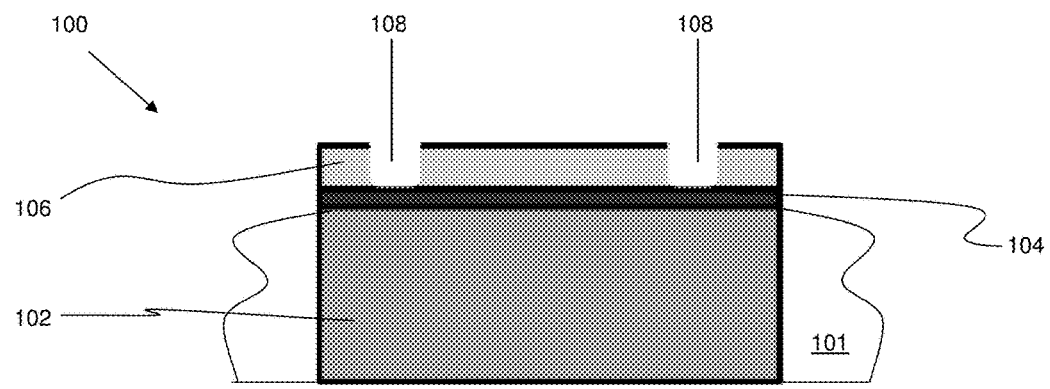
FIG. 1 shows a cross-sectional view of a structure and respective fabrication processes in accordance with aspects of the present disclosure.

FIG. 1 shows a cross-sectional view of a structure and respective fabrication processes in accordance with aspects of the present disclosure. More specifically, the structure 100 includes a conductive material 102. In embodiments, the conductive material 102 can be copper, although other materials are contemplated herein. Additionally, the conductive material 102 can take various shapes such as annular buried metal or a block of buried metal in a substrate, among other examples. Further, and preferably, the conductive material 102 can be a through-silicon via (TSV) or another interconnect structure, for example, formed within a substrate 101. Therefore, in embodiments, the conductive material 102 can be a copper (Cu) TSV-like structure. This conductive material 102 can be deposited using conventional deposition processes, such as physical vapor deposition (PVD), electroplating methods such as electrolytic plating or electroless plating, chemical vapor deposition (CVD), plasma-enhanced chemical vapor deposition (PECVD), and atomic layer deposition (ALD), as illustrative examples.

Still referring to FIG. 1, an insulating material 104 is formed on the conductive material 102. In embodiments, the insulating material 104 can be a dielectric material such as SiN or $SiO_2$, as examples. In embodiments, the insulating material 104 can be deposited by conventional processes, e.g., CVD. A photoresist 106 is deposited onto the dielectric layer 104. In embodiments, openings 108 are formed in the photoresist 106 using conventional lithography processes, e.g., by exposing the photoresist 106 to energy (e.g. light). The openings 108 will expose the underlying dielectric layer 104.

Figure 2:
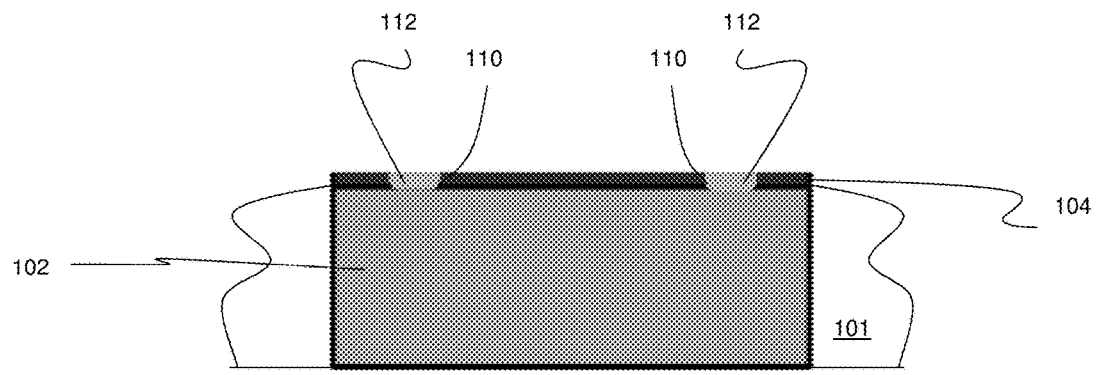
FIG. 2 shows a cross-sectional view of non-corrosive materials deposited in a dielectric layer of the structure and respective fabrication processes in accordance with aspects of the present disclosure.

As shown in FIG. 2, the dielectric layer 104 undergoes an etching process which forms a corresponding opening or via 110, exposing the underlying conductive material 102. In embodiments, the etching process can be a conventional reactive ion etching (RIE) using chemistries selective to the insulating material 104. A non-corrosive conductive material 112 is deposited within the vias 110 to directly contact the underlying conductive material 102. In embodiments, the non-corrosive material 112 will provide a hermetic seal which block water entry and corrosion which may occur in upper wiring layers, as examples. The non-corrosive material 112 can be deposited using conventional CVD processes, followed by a chemical mechanical planarization (CMP) process in order to remove any residual material from the surface of the insulating material 104. The non-corrosive conductive material 112 can be deposited to a thickness of about 10 Å to about 20 Å; although other dimensions are contemplated herein depending on the particular technology node.

The non-corrosive conductive material 112 can be any suitable non-corrosive material, for example, a refractory metal. More specifically, the non-corrosive conductive material 112 can include, e.g., tungsten or tantalum or other high melting point metal which is corrosion resistant or other refractory metal. In further embodiments, the non-corrosive conductive material 112 can include a noble metal such as palladium or platinum. Prior to the deposition of the non-corrosive conductive material 112, a seed layer can be deposited.

Figure 3:
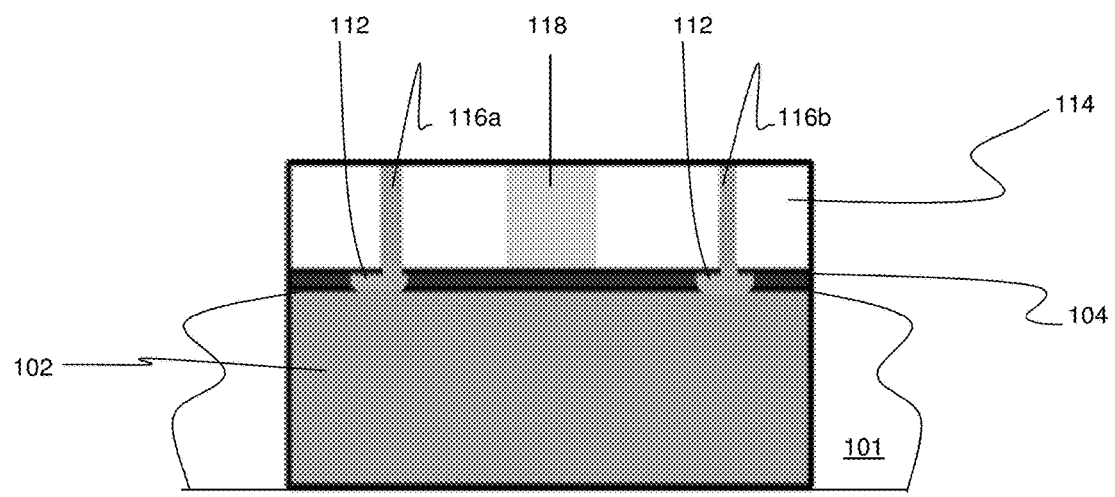
FIG. 3 shows a cross-sectional view of a structure with wiring layers and a crackstop structure and respective fabrication processes in accordance with aspects of the present disclosure.

In FIG. 3, an interlevel dielectric material 114 is deposited on the insulating material 104 and the non-corrosive conductive material 112. The dielectric layer 114 can be an oxide based material or other interlevel dielectric (ILD) material. The dielectric layer 114 can undergo conventional lithography and etching steps to form an opening for wiring layers 116a, 116b and crackstop structure 118. In embodiments, the crackstop structure 118 is provided between the wiring layers 116a, 116b. In embodiments, the various processes for forming the wiring layers 116a, 116b and crackstop structure 118 include depositing a photoresist, applying energy to the photoresist to form openings, transferring of the openings into the dielectric material 114 by an etching process, followed by deposition of material within openings, and a CMP process to remove any residual material. In embodiments, the wiring layers 116a, 116b and crackstop structure 118 can be formed from any conductive metal such as copper or aluminum.

In embodiments, the wiring layers 116a, 116b are stacked via metal lines and, more particularly, stacked Cu lines/vias, in direct electrical contact with the non-corrosive conductive material 112. In embodiments, the wiring layers 116a, 116b provide an electrical connection around the crackstop structure 118, e.g., provides electrical connection from the inside to outside of the crackstop structure 118, while maintaining crackstop structure functionality. Moreover, the wiring layers 116a, 116b can provide electrical connection around the crackstop structure 118 without requiring continuous, transverse wiring in the same plane as the crackstop structure 118. Additionally, the non-corrosive conductive material 112 will prevent/block corrosion from occurring at the conductive material 102, e.g., by acting as a barrier layer from corrosion spreading from the wiring layers 116a, 116b to the conductive material 102.

In embodiments, the wiring layers 116a, 116b and crackstop structure 118 can be of different heights depending on the final design parameters and the stages of testing. For example, the wiring layers 116a, 116b can be formed at a height below the crackstop structure 118 when testing is performed during the build process. Alternatively, for example, the wiring layers 116a, 116b can be formed at the same height or higher than the crackstop structure 118 when testing is performed at another stage of processing. Also, the wiring layers 116a, 116b can be provided both inside and outside the crackstop structure 118, in any combination of heights. Further, the wiring layers 116a, 116b (and the crackstop structure 118) can be fabricated at the same time using the same CMOS processes.

Figure 4:
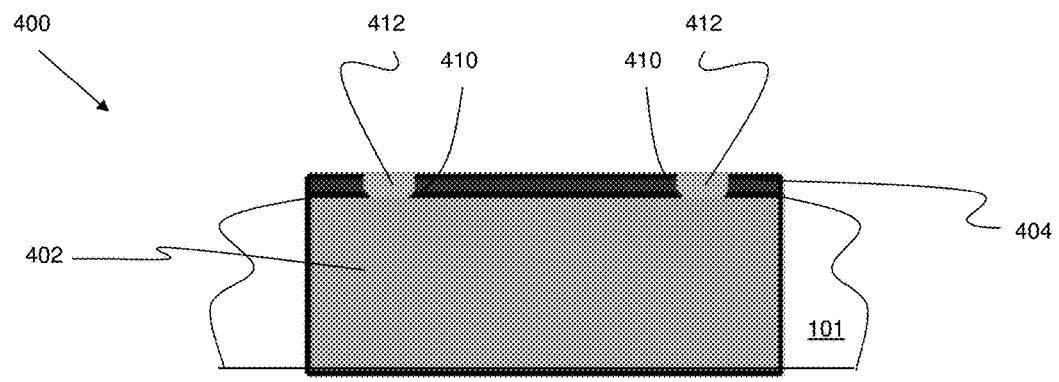
FIGS. 4-7 show respective structures and respective fabrication processes in accordance with alternative aspects of the present disclosure.

FIGS. 4-7 show respective structures and respective fabrication processes in accordance with alternative aspects of the present disclosure. As shown in FIG. 4, a structure 400 includes a conductive material 402. Similar to conductive material 102, the conductive material 402 can be copper, although other materials are contemplated herein. Additionally, the conductive material 402 can take various shapes as described herein, and is preferably a through-silicon via (TSV) or another interconnect structure, for example. The conductive material 402 can be deposited using conventional deposition processes as already described herein.

In addition, an insulating material 404 is formed above the conductive material 402. Similar to the conductive material 402, the insulating material 404 can be deposited by CVD, among other examples. At least one pair of vias 410 is formed in the insulating material 404 by conventional lithography and etching processes as already described herein such that further explanation is not required for a complete understanding of the present disclosure.

Continuing with FIG. 4, a non-corrosive conductive material 412 is deposited within the vias 410 to directly contact the underlying conductive material 402. The non-corrosive conductive material 412 can be any suitable material, e.g., a refractory metal as described already herein. The non-corrosive conductive material 412 can be deposited by conventional deposition processes, followed by a CMP process in order to remove any residual material from a top surface of the insulating material 404.

Figure 5:
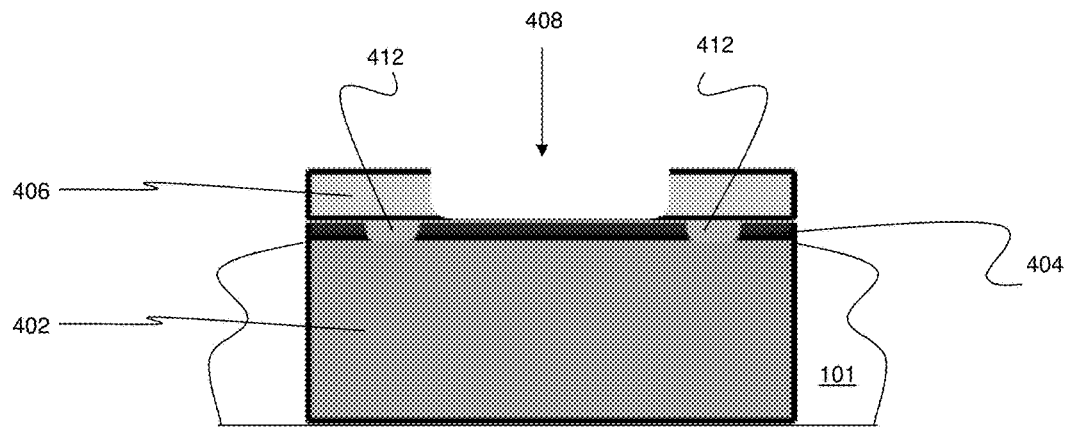

As shown in FIG. 5, a photoresist 406 is deposited onto the insulating material 404. The photoresist 406 undergoes conventional lithography processes by exposing the photoresist 406 to energy (e.g. light). The conventional lithography technique allows for the formation of an opening 408, which exposes the underlying insulating material 404, between the non-corrosive conductive material 412.

Figure 6:
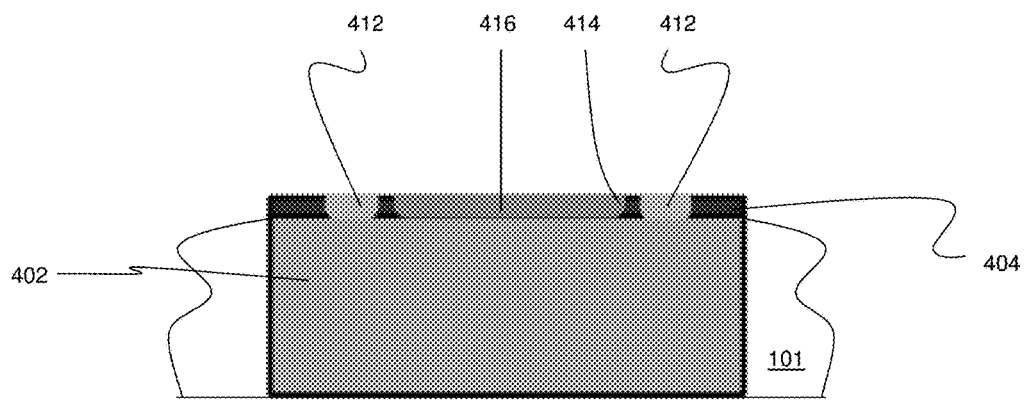

In FIG. 6, the insulating material 404 is etched to form an opening 414, between the non-corrosive conductive material 412. A dielectric barrier material 416 with hermetic properties superior to that of the dielectric material used to construct layer 404, e.g., SiN, can then be deposited in this opening 414 followed by a polishing, e.g., a nitride polish. In embodiments, the barrier material 416 is a hermetic insulator material. In this way, the structure shown in FIG. 6 will include a hermetic seal with an additional masking or barrier layer.

Figure 7:
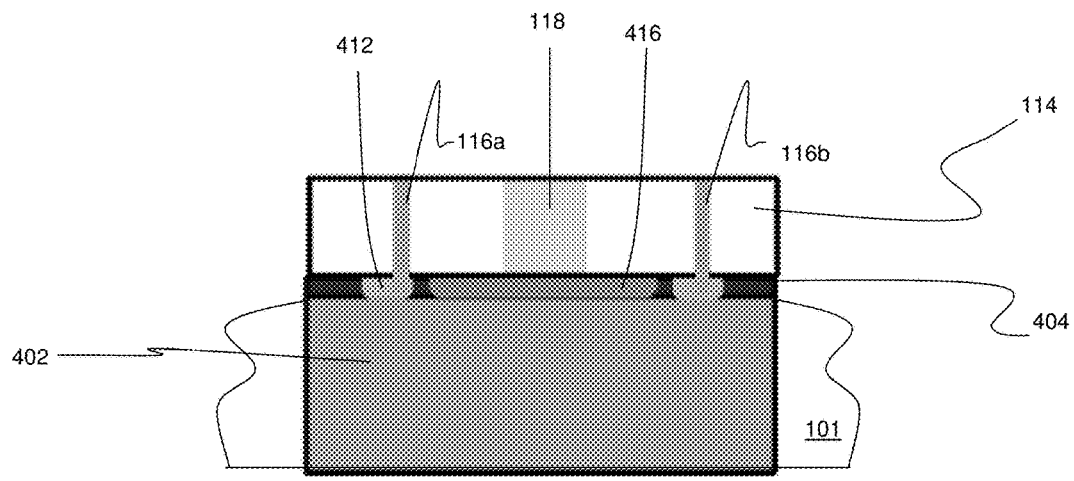

Referring to FIG. 7, a dielectric layer 414 is deposited on the insulating material 404 and, more particularly, over the non-corrosive conductive material 412 and the barrier material 416. As previously described, the dielectric layer 414 can be an oxide based material or other interlevel dielectric (ILD) material. The dielectric layer 414 can undergo conventional lithography and etching processes to form an opening for wiring layers 116a, 116b and crackstop structure 118, as previously described.

As in any of the embodiments, the wiring layers 116a, 116b can be stacked via metal lines and, more particularly, stacked Cu lines/vias. In embodiments, the wiring layers 116a, 116b can be in direct electrical contact with the non-corrosive conductive material 412, and the crackstop structure 118 can be in direct contact with the barrier material 416. As previously described, the wiring layers 116a, 116b provide electrical connection around the crackstop structure 118 without requiring continuous, transverse wiring in the same plane as the crackstop structure 118. Additionally, the non-corrosive conductive material 412 prevents corrosion from occurring at the conductive material 402, e.g., by acting as a barrier layer from corrosion spreading from the wiring layers 116a, 116b to the conductive material 402. Moreover, the wiring layers 116a, 116b (and crackstop structure 118) can be of different heights depending on the final design parameters and the stages of testing. Further, the wiring layers 116a, 116b (and crackstop structure 118) wiring can be fabricated at the same time with the same CMOS processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   a conductive material;
   a dielectric material formed over the conductive material;
   a non-corrosive conductive material in at least one opening of the dielectric material and in direct electrical contact with the conductive material;
   a crackstop structure formed over the dielectric material;
   at least a first wiring layer on a first side of the crackstop structure and in electrical contact with the non-corrosive conductive material in a first opening of the dielectric material above the conductive material; and
   at least a second wiring layer on a second side of the crackstop structure and in electrical contact with the non-corrosive conductive material in a second opening of the dielectric material above the conductive material, wherein the conductive material is a copper through-silicon via (TSV) structure.

2. The structure of claim 1, wherein the conductive material is copper.

3. The structure of claim 1, wherein the non-corrosive conductive material is a refractory metal which provides electrical contact between the first wiring layer and the conductive material and the second wiring layer and the conductive material.

4. The structure of claim 1, wherein the non-corrosive conductive material is a noble metal.

5. The structure of claim 1, wherein the non-corrosive conductive material is a high temperature corrosion resistant metal.

6. The structure of claim 1, wherein the least one of wiring layer is a plurality of wiring layers formed as stacked via metal lines.

7. The structure of claim 6, wherein the plurality of wiring layers are formed on inside and outside with respect to the crackstop structure.

8. The structure of claim 7, wherein the plurality of wiring layers and the crackstop structure comprises copper.

9. The structure of claim 5, wherein the plurality of wiring layers have a height less than or equal to a height of the crackstop structure.

10. The structure of claim 1, wherein the crackstop structure is formed on a barrier layer.

11. The structure of claim 10, wherein the barrier layer is a nitride material formed in the dielectric layer, between the non-corrosive conductive material and separated from the non-corrosive conductive material by the dielectric layer so that the at least one wiring layer is not formed over the barrier layer.

12. A structure, comprising:
   a conductive material;
   a barrier layer over the conductive material;
   a non-corrosive conductive material in direct electrical contact with the conductive material and within openings in the barrier layer;
   crackstop structure formed in a dielectric material and separated from the conductive material by the barrier layer; and first and second wiring layers extending from and in direct electrical contact with the non-corrosive conductive material, the first wiring layer positioned on an inside of the crackstop structure and the second wiring layer positioned on an outside of the crackstop structure, wherein the conductive material is a through silicon via (TSV)-structure.

13. The structure of claim 12, wherein the non-corrosive material is a refractory metal.

14. The structure of claim 13, wherein the refractory metal is tungsten.

15. The structure of claim 12, further comprising a hermetic barrier material formed within the barrier layer and which separates the crackstop structure and the conductive material.

16. The structure of claim 15, wherein the hermetic barrier material is SiN.

17. The structure of claim 12, wherein the crackstop structure and the plurality of wiring layers comprise copper.

18. A method, comprising:
forming a dielectric material over a conductive material;
forming a non-corrosive conductive material in at least one opening of the dielectric material and in direct electrical contact with the conductive material;
forming a barrier layer over the non-corrosive conductive material;
forming a crackstop structure formed over the dielectric material and on the barrier layer; and
forming first and second wiring layers both in direct electrical contact with the non-corrosive conductive material, the first wiring layer formed on a first side of the crackstop structure and the second wiring layer formed on a second side of the crackstop structure, wherein the barrier layer is a nitride material formed in the dielectric layer, between the non-corrosive conductive material and separated from the non-corrosive conductive material by the dielectric layer so that the at least one of the first and second wiring layers is not formed over the barrier layer.

\* \* \* \* \*